United States Patent

Holmberg et al.

[11] Patent Number: 6,160,270
[45] Date of Patent: *Dec. 12, 2000

[54] PERFORMANCE MATRIX, METHOD OF MAKING AN ACTIVE MATRIX DISPLAYS INCORPORATING AN IMPROVED TFT

[75] Inventors: Scott H. Holmberg, Pleasanton; Rajesh Swaminathan, Santa Clara, both of Calif.

[73] Assignee: Hyundai Electronics America, Inc., San Jose, Calif.

[*] Notice: This patent is subject to a terminal disclaimer.

[21] Appl. No.: 09/013,501

[22] Filed: Jan. 26, 1998

Related U.S. Application Data

[63] Continuation of application No. 08/618,597, Mar. 27, 1996, Pat. No. 5,731,216.

[51] Int. Cl.[7] .................... H01L 29/04; H01L 31/036; H01L 31/0376; H01L 31/20; H01L 27/15
[52] U.S. Cl. .............................................. 257/59; 257/72
[58] Field of Search ........................ 257/59, 72; 438/30, 438/149, 157, 158

[56] References Cited

U.S. PATENT DOCUMENTS

| | | | |
|---|---|---|---|
| 5,643,817 | 7/1997 | Kim et al. | 205/124 |
| 5,731,216 | 3/1998 | Holmberg et al. | 438/30 |
| 5,874,746 | 2/1999 | Homlberg et al. | 257/59 |
| 5,903,326 | 5/1999 | Lee | 349/42 |

*Primary Examiner*—Brian Dutton
*Attorney, Agent, or Firm*—Townsend and Townsend and Crew LLP

[57] ABSTRACT

Improved multilayer matrix line including inverted gate thin film matrix transistors to reduce defects in and enhance performance of matrix devices incorporating the transistors, including active matrix displays. The inverted gate line is formed in a multilayer metal structure deposited sequentially before patterning of a first bottom refractory layer, an aluminum layer and a second refractory layer for the gate structure. The aluminum layer is anodized adjacent the gate to prevent step coverage problems. A further improvement is provided when forming an active matrix display storage capacitor utilizing the multilayer gate structure.

17 Claims, 17 Drawing Sheets

17) Deposit 2nd passivation, pattern, & remove from tab bonding pads of periphery of display

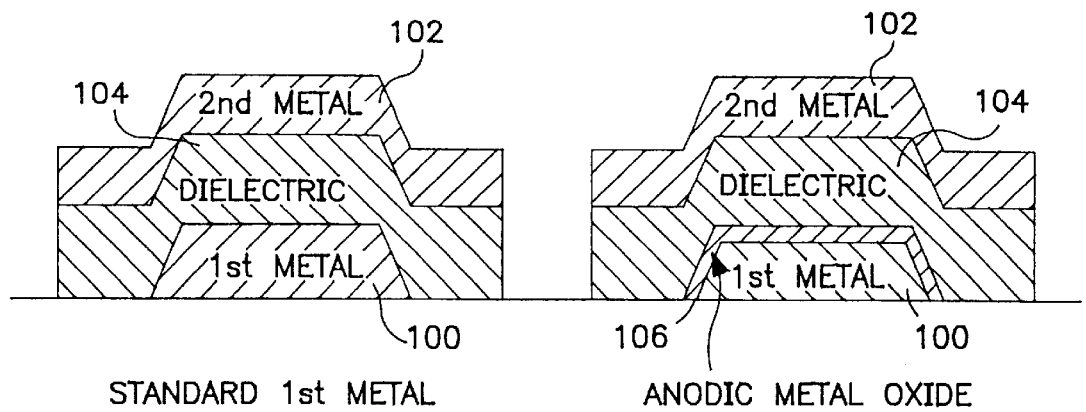
FIG. 4A  STANDARD 1st METAL
FIG. 4B  ANODIC METAL OXIDE
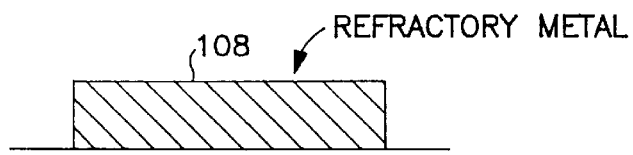
FIG. 5A
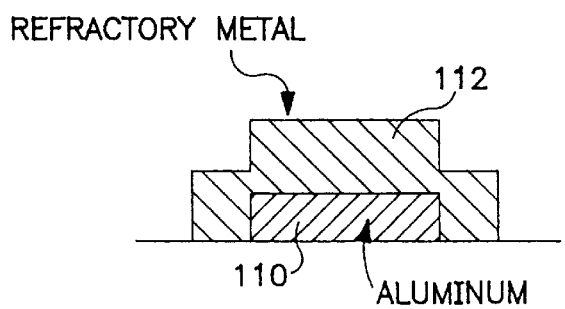
FIG. 5B
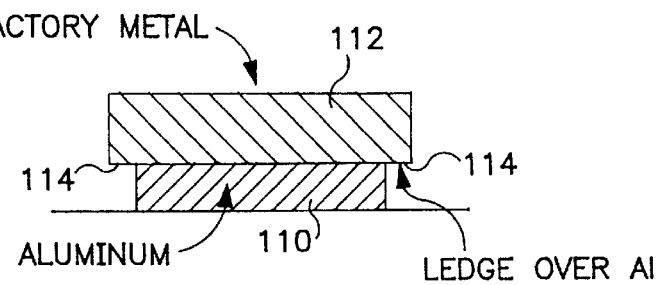
FIG. 5C

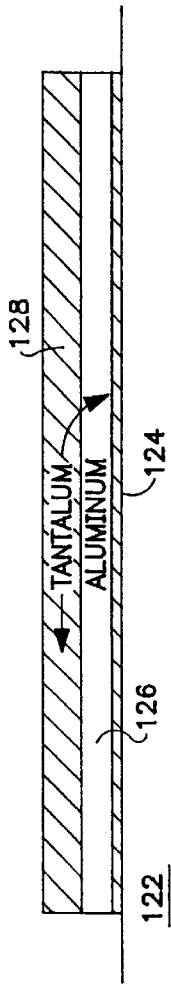
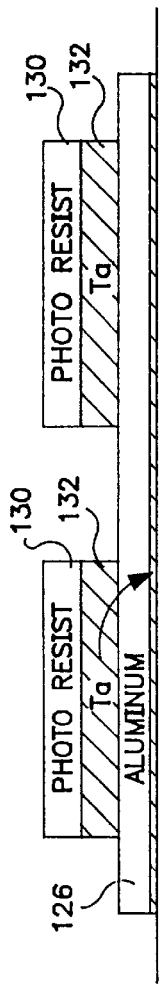
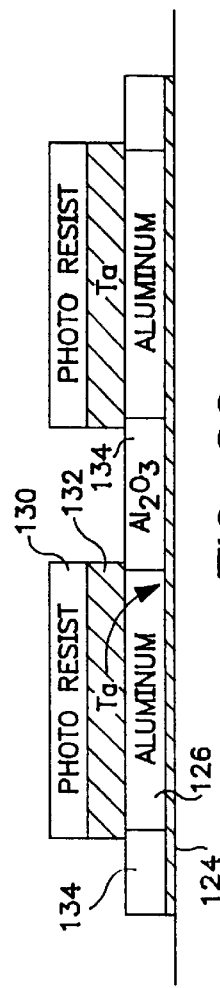
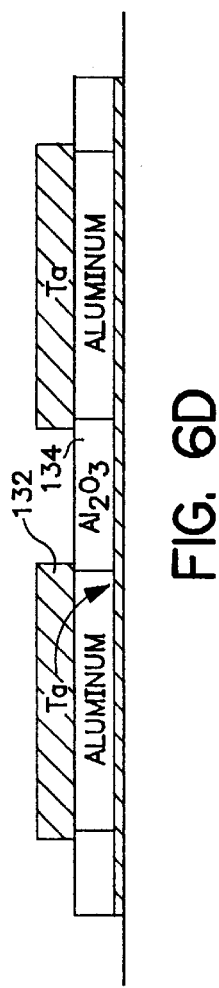
FIG. 6A
1) Deposit sequential layers of tantalum, aluminum & tantalum
FIG. 6B
2) Apply & pattern PR, etch Ta
FIG. 6C
3) Anodize aluminum
FIG. 6D
4) Strip Resist & pattern contact pads on array periphery with PR to inhibit anodization

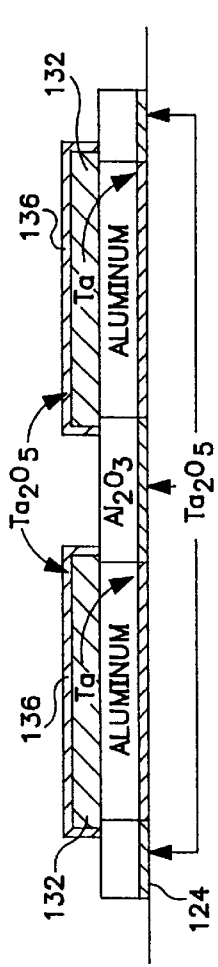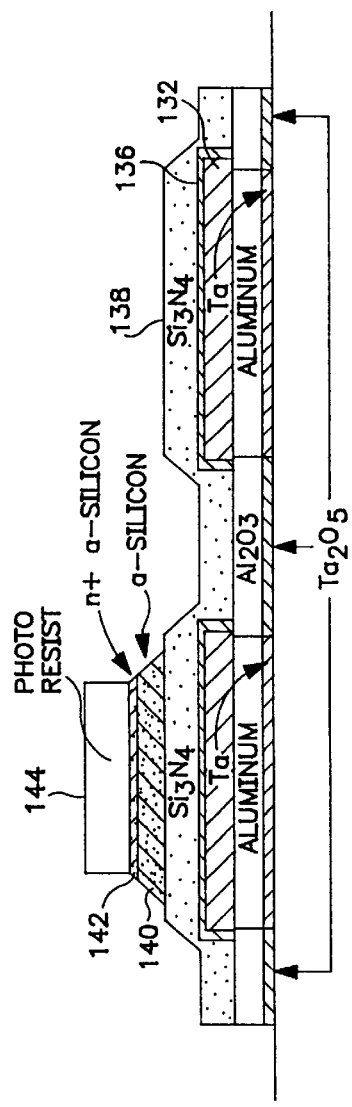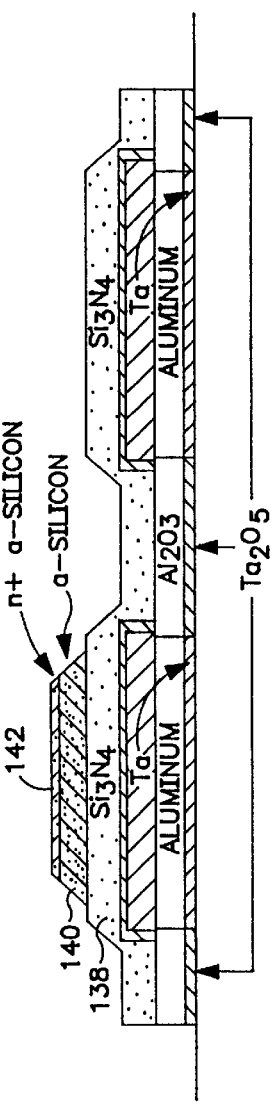

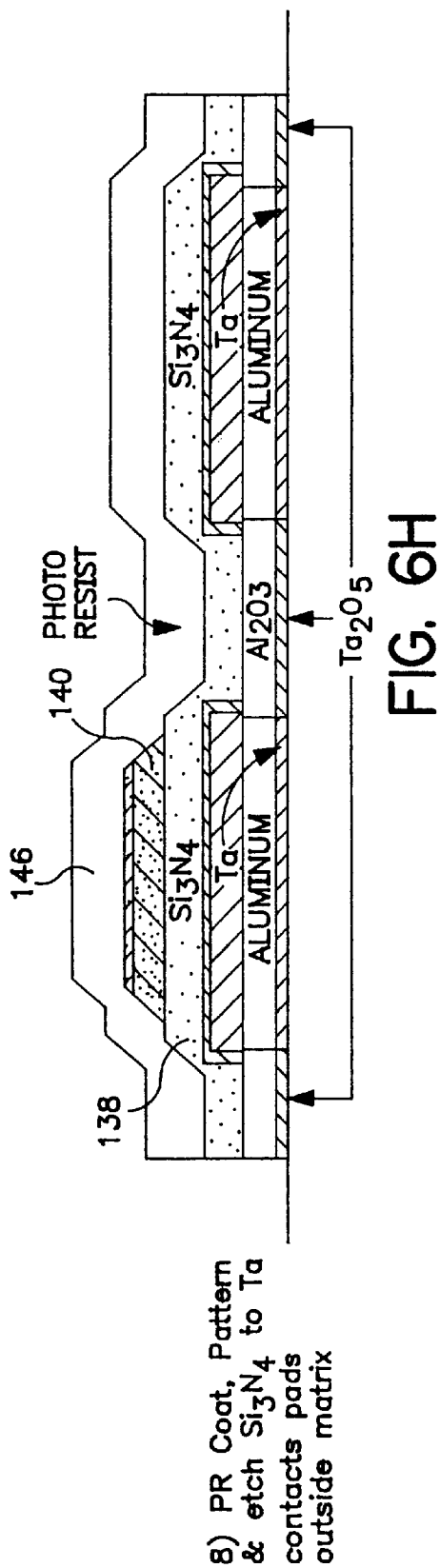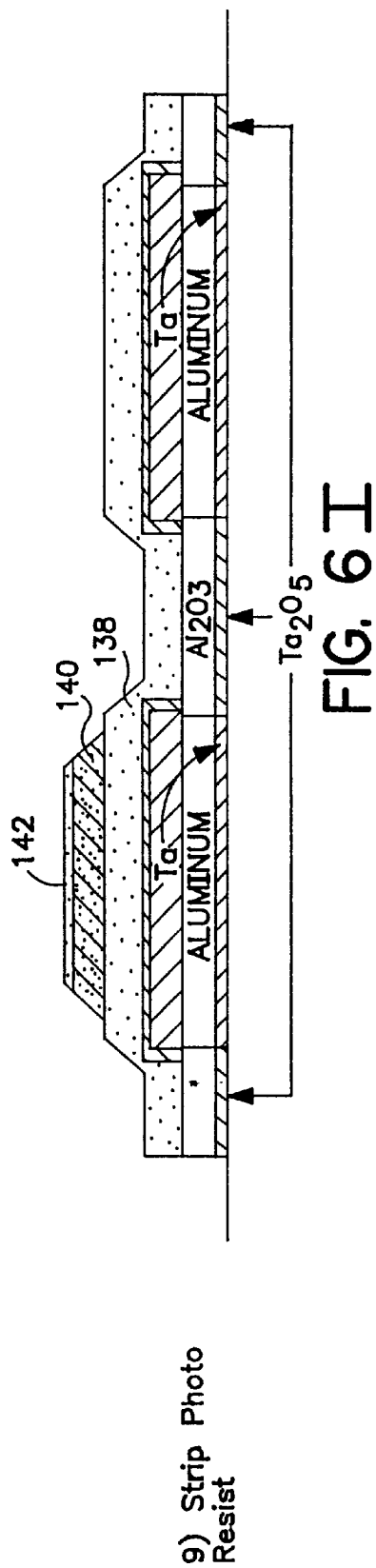

10) Deposit & pattern S-D metal, pattern & etch

11) Strip Photo Resist

12) Etch N+ a-silicon

13) Deposit, pattern & etch passivation

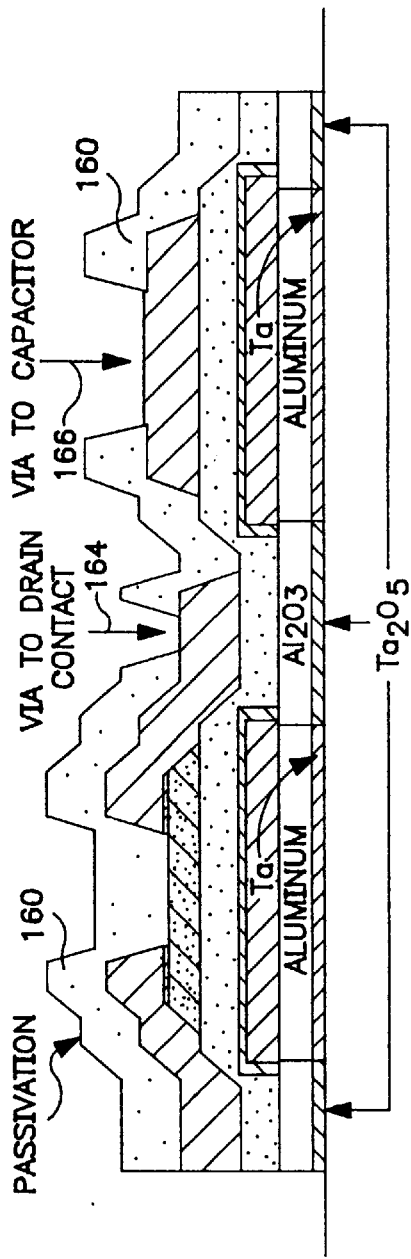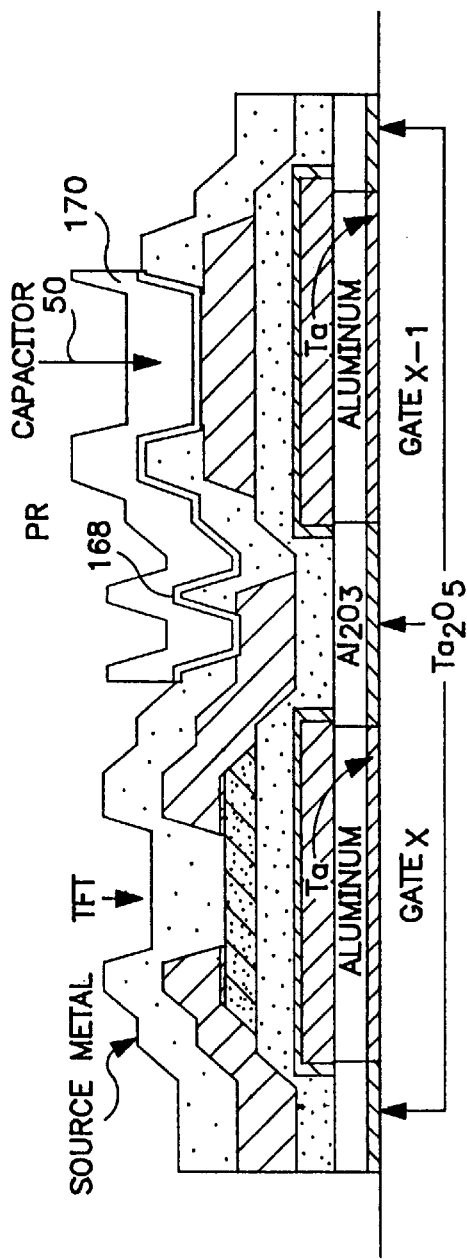

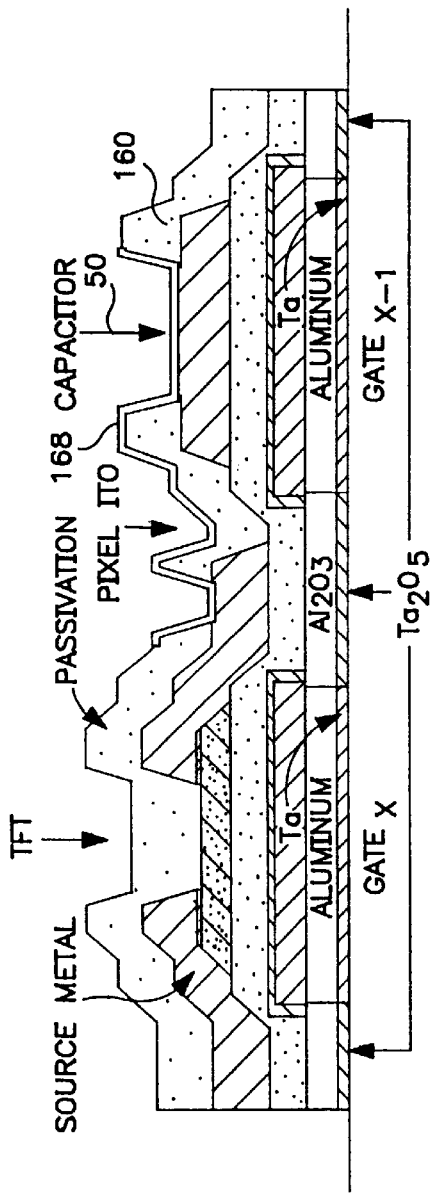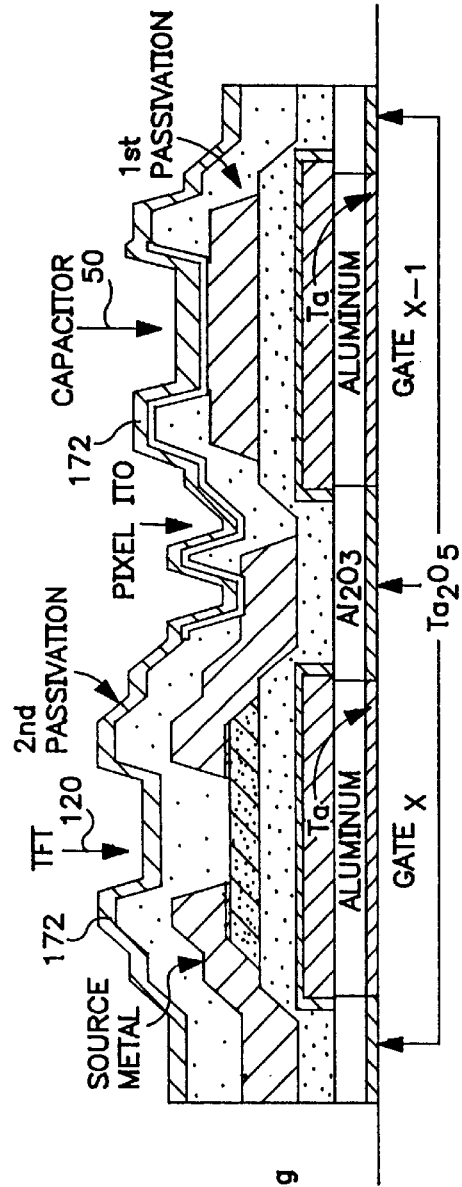

1) Deposit sequential layers of tantalum, aluminum & tantalum

2) Apply & pattern PR, etch Ta

3) Anodize aluminum

4) Strip Resist & pattern contact pads on array periphery with PR to inhibit anodization 5) Anodize Ta to 60 volts

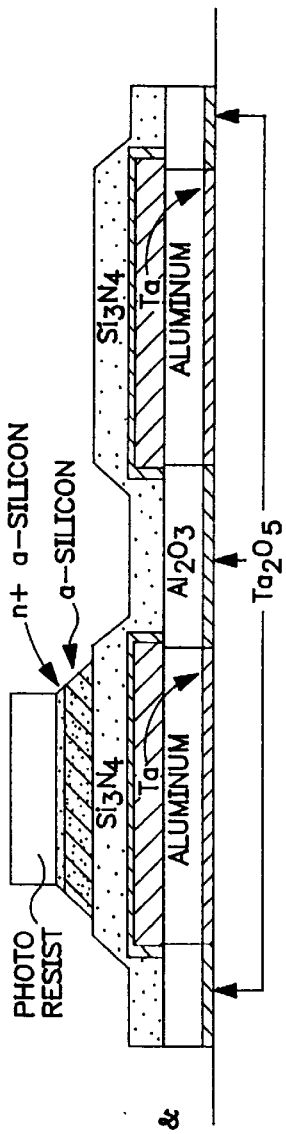
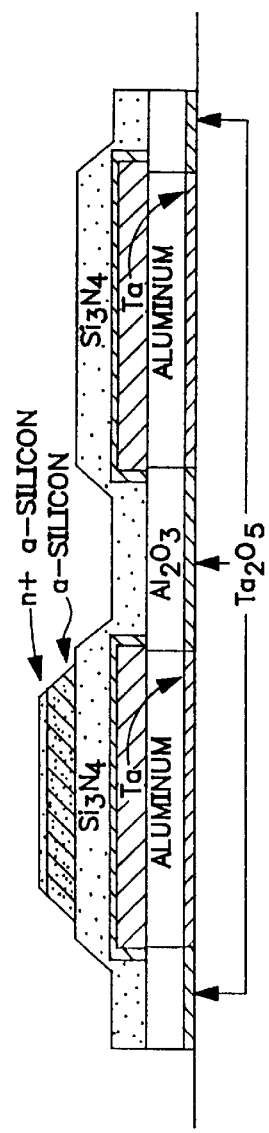
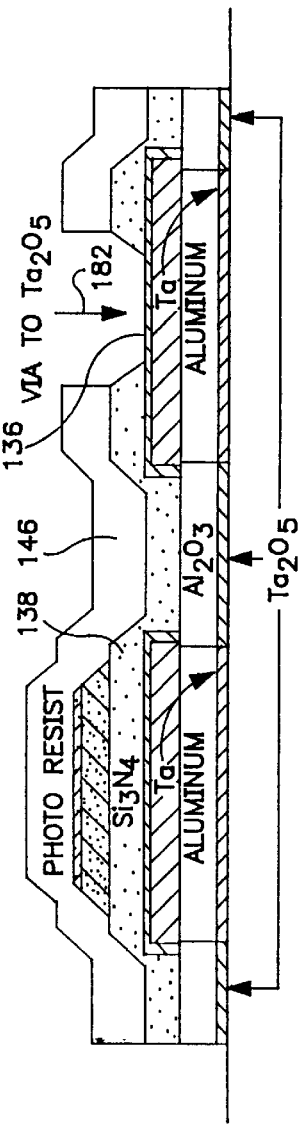

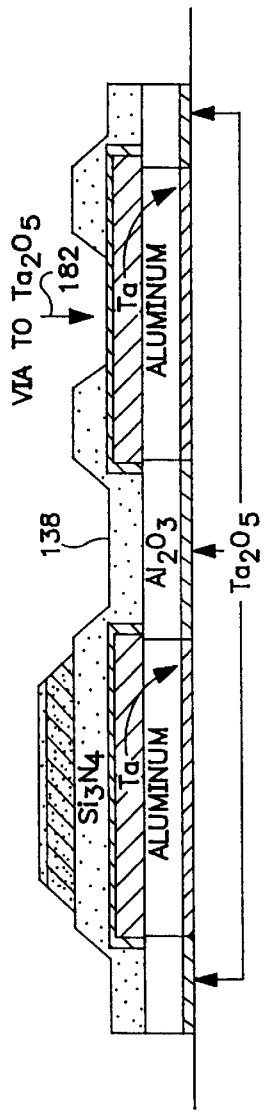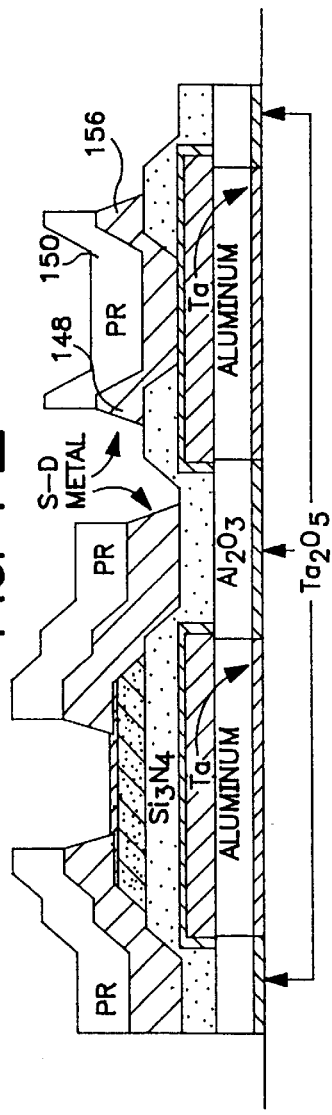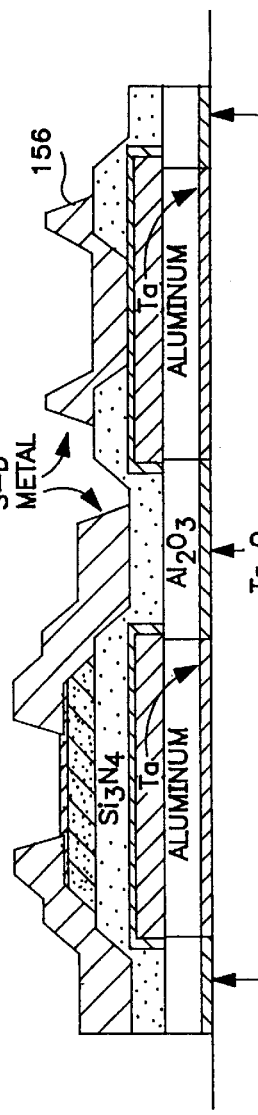

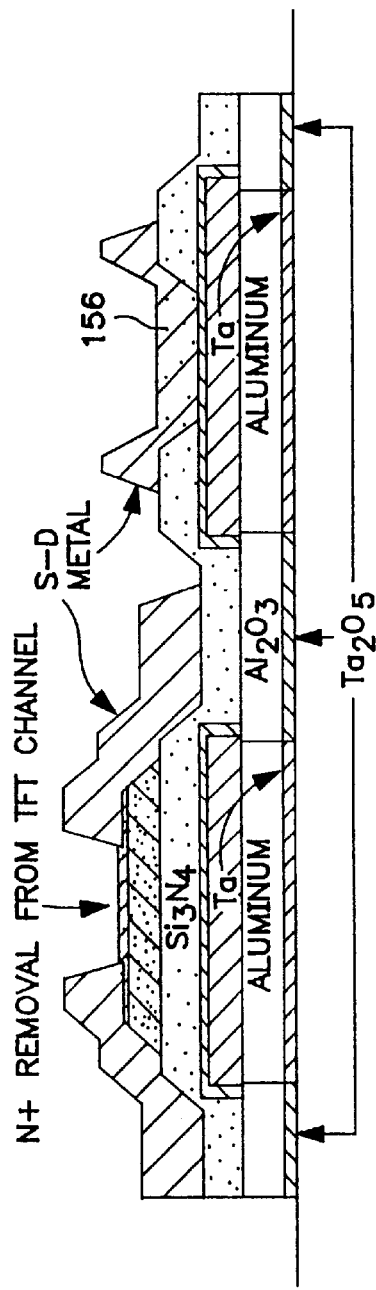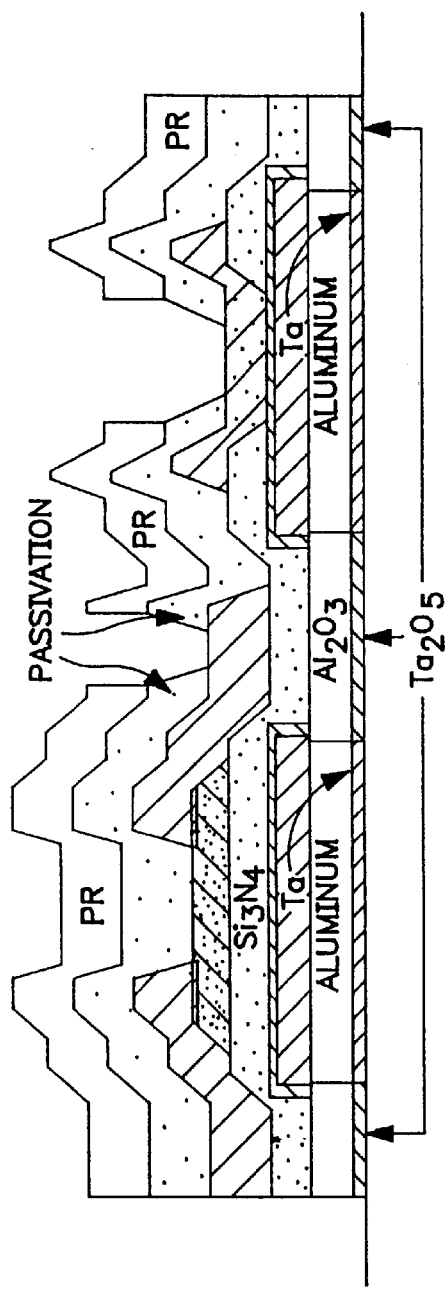

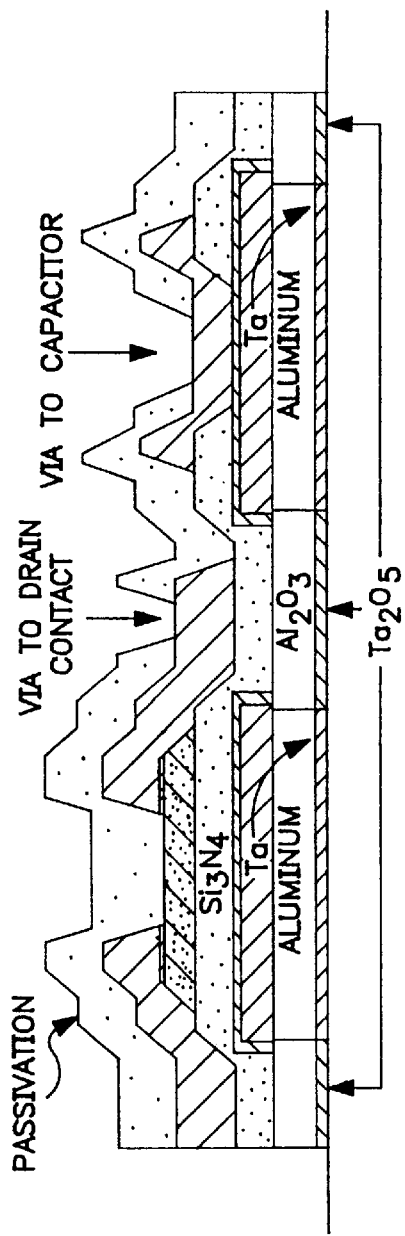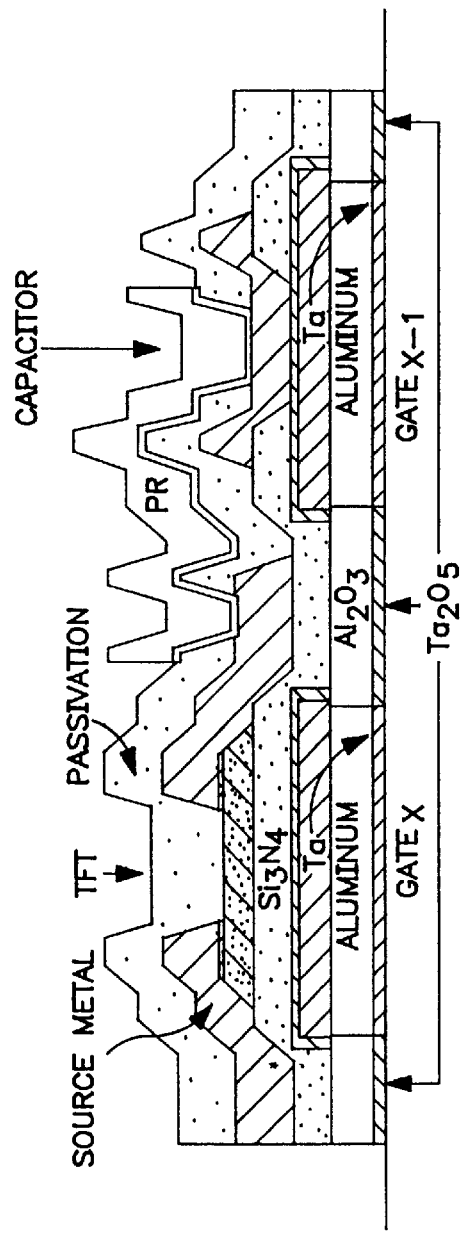

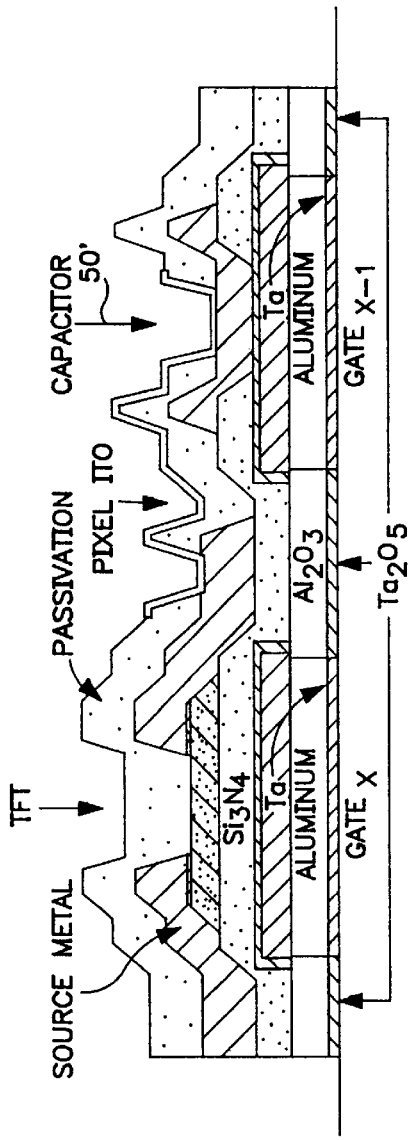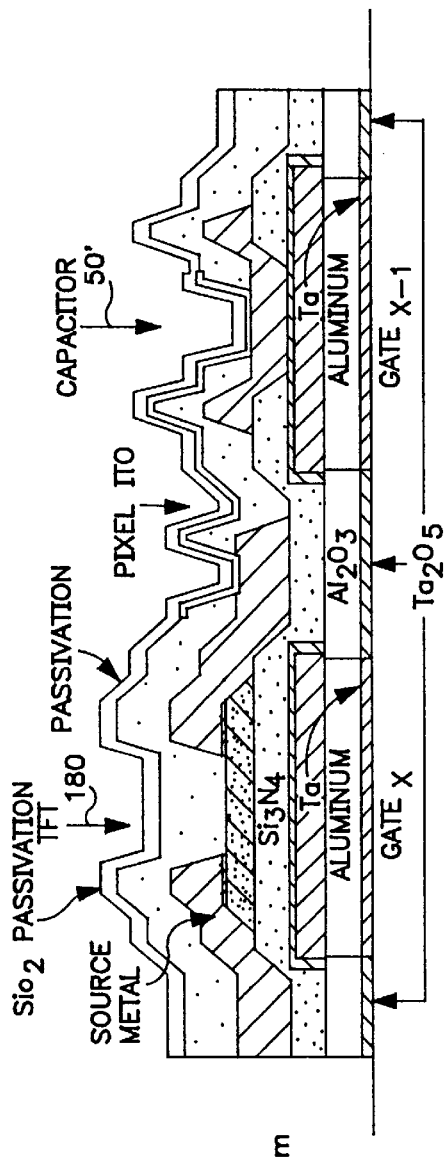

PERFORMANCE MATRIX, METHOD OF MAKING AN ACTIVE MATRIX DISPLAYS INCORPORATING AN IMPROVED TFT

This application is a continuation of Application No. 08/618,597, Mar. 27, 1996, that issued as U.S. Pat. No. 5,731,216.

BACKGROUND OF THE INVENTION

The present invention pertains to an improved performance thin film matrix, method of making the thin film matrix and matrix displays incorporating an improved transistor. More particularly, the present invention is directed to a method of making multilayer thin film matrices to increase the yield of the finished matrix devices made therefrom and increase matrix scalability and performance.

In recent years there has been growing interest in thin film transistors (TFT's) and matrix devices incorporating such thin film transistors, such as memory arrays, all types of integrated circuits and replacements for mechanical switches and relays. For example, reed relays can fatigue and MOS switches exhibit too much leakage current.

A specific exemplary use of the thin film matrix transistor is in flat panel displays, such as those which employ liquid crystals, electrochromic or electroluminescense, as replacements for conventional cathode ray tubes (CRT's). The flat panel displays promise lighter weight, less bulk and substantially lower power consumption than CRT's. Also, as a consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen than it does to the middle, the beam strikes various points on the screen at different angles with resulting variation in spot size and shape (i.e. distortion).

Flat panel displays are inherently free of such distortion, because each pixel is photolithographically patterned on the substrate as opposed to being defined by where the CRT electron beam strikes the phosphor on the screen. In the manufacture of the flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (emissive) or modulates the transmission of ambient light (non-emissive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. The optically active medium on each contact is generally referred to as a picture element or "pixel".

The circuitry for a flat panel display is generally designed such that data is generally shifted in on all the column lines each to a predetermined voltage. The conductivity, integrity and reliability of the row and column lines in flat panel and other matrix devices is critical. High conductivity lines are utilized in field emission devices (FED's) and other matrix devices, such as active matrix devices. In an active matrix device, one row is energized to turn on all the transistors in that row (one row is written at a time). That row is then shut off and the data for the next row is shifted into 11 the column lines and then the second row is energized and written. This process is repeated until all the rows have been addressed. All the rows are generally written in one frame period, typically about 1/60th of a second or about 16.7 ms. Then voltages representing the data are supplied selectively to particular columns to cause selected pixels to light up or change optical properties as the row is written. The pixels can be made to change intensity by applying a large voltage or current or a longer pulse of voltage or current. Utilizing liquid crystal display (LCD's) with twisted nematic active material, the display is substantially transparent when not activated and becomes light absorbing when activated or vice versa depending upon polarizer orientation. Thus, the image is created on the display by sequentially activating the pixels, row by row across the display matrix. The geometric distortion described above with respect to CRT's is not a factor in flat panel displays since each pixel location is photolithographically determined and fixed.

One of the major problems that arises with respect to the prior art method of manufacturing structures for active matrix displays (e.g. those employing nonlinear control elements, such as thin film diodes, MIM's or thin film transistors at each pixel) is that they generally suffer production yield problems similar to those of integrated circuits. That is, the yields of devices produced are generally not 100% and the yield (percentage of devices with no defects) can be 0% in a worst case. High quality displays will not tolerate any defective control elements or other components. Also, larger size displays are generally more desirable than smaller size displays. Thus, a manufacturer is faced with the dilemma of preferring to manufacture larger size and/or higher resolution displays, but having to discard the entire product if more than a few transistors and hence if more than a few pixels are defective. In other words, the manufacturer suffers a radically increased manufacturing cost per unit resulting from decreasing usable product yield.

One desirable matrix transistor includes an inverted gate formed on a matrix substrate. In inverted gate TFT LCD structures, the gate metal is generally deposited directly onto a glass substrate. To provide a high performance TFT arrays, the gate metal should have high conductivity, good adhesion to both the substrate and subsequent layers, not form hillocks during the subsequent required high temperature processing, have a minimal step coverage over the gate metal for subsequent layers and the gate metal should be capable of being anodized.

In an attempt to solve these problems, a number of solutions have been attempted, including a single refractory metal layer gate, an aluminum or aluminum/silicon and/or copper alloy gate metal, combinations of a refractory metal and an aluminum gate metal and even a thick etched single layer metal gate. Each of these attempted solutions includes one or more problems as described hereinafter.

These problems of increased cost and decreased yield are dramatically improved in the present invention by providing a method of manufacturing improved matrices including inverted gate matrix transistors having a high performance multilayer gate metal structure with a greatly reduced number of matrix defects which can be utilized in all types of integrated circuits, such as active matrix displays.

SUMMARY OF THE INVENTION

There is provided improved methods of making matrices, including inverted gate thin film matrix transistors to reduce defects in and enhance the performance of the devices incorporating the transistors, including active matrix displays. The inverted gate line is formed in a multilayer metal structure deposited sequentially before patterning. The multilayer structure includes a first bottom refractory layer, an aluminum layer and a second refractory layer to form the gate structure. The aluminum layer is anodized adjacent the gate to prevent step coverage problems for additional deposited layers, especially at the matrix crossover points. The multilayer gate structure adheres to the substrate and subsequent layers, has high conductivity and suppresses hillocks, hence increasing the yield of the resulting matrix device. A further improvement is provided by forming an active matrix display storage capacitor utilizing the multilayer gate structure.

BRIEF DESCRIPTION OF THE DRAWINGS

FIGS. 4A and 4B are partial cross-sectional views illustrating a crossover point of two matrix metal layers with a dielectric therebetween;

FIGS. 5A–5C are partial cross-sectional views of some matrix metal manufacturing steps;

DESCRIPTION OF THE PREFERRED EMBODIMENTS

Figure 1:
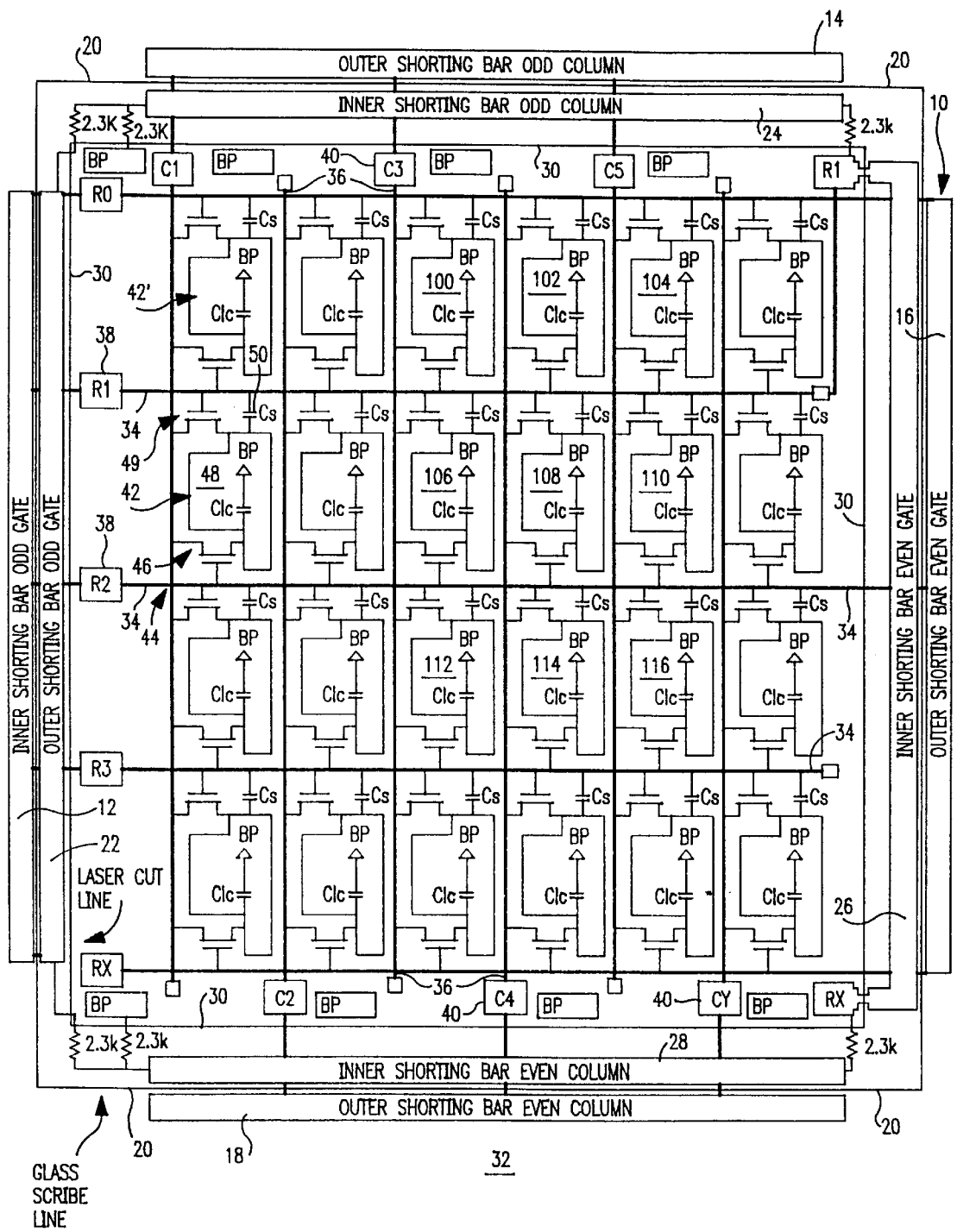
FIG. 1 is a plan view schematic representation of an active matrix display incorporating the multilayer line and the transistor of the present invention.

As before mentioned, numerous devices can be formed utilizing thin film transistors (TFT's), one particular utilization is in active matrix liquid crystal displays (AMLCD's) and the multilayer line and the inverted gate TFT of the present invention will be described as a portion of an AMLCD. Referring to FIG. 1, a schematic representation of an AMLCD which can incorporate the present invention is designated generally by the reference numeral 10.

The AMLCD 10 is illustrated including a set of optional outer shorting bars 12, 14, 16 and 18, which are more fully described in copending application Ser. No. 08/497,372, ACTIVE MATRIX ESD PROTECTION AND TESTING SCHEME, filed Jul. 31, 1995 and incorporated herein by reference. The outer shorting bars 12, 14, 16 and 18 are removed during processing by breaking them away along a scribe line 20, as more fully described in Ser. No. 08/497,372.

The AMLCD 10 also is illustrated including a set of inner shorter bars 22, 24, 26 and 28. The inner shorting bars 22, 24, 26, and 28 also are utilized during processing, as more fully described in Ser. No. 08/497,372. However, the inner shorting bars 22, 24, 26 and 28 preferably only are electronically disconnected from the AMLCD 10 along a line 30, but remain a physical part of the AMLCD 10.

The AMLCD 10 is deposited on a substrate 32, commonly formed from a glass panel, which is broken away along the scribe line 20. The substrate 32 also can be formed from other types of insulating materials, including a metallic panel with an insulative coating. The AMLCD 10 is formed with a plurality of row lines 34 and a plurality of column lines 36 forming a large matrix, only a small portion of which is illustrated. The row lines 34 include one of a plurality of driver contact pads 38 connected to each line 34 and the column lines 36 also include one of a plurality of driver contact pads 40 connected to each line 36.

The AMLCD 10 includes a plurality of identical pixels formed between the row lines 34 and the column lines 36, therefore only one pixel 42 will be described in detail. At each matrix crossover point 44, where a row line 34 and a column line 36 cross, a TFT 46 is formed to connect both lines to a pixel contact 48. The active liquid crystal medium is deposited at least over the contact 48, which medium will change properties in response to the combined voltage or current at the crossover point 44. The medium on the pixel 42 will generally appear as a square, rectangle or dot in the overall matrix of the AMLCD 10. The actual size of the transistor 46 and the contact 48 are not drawn to scale, but are shown schematically for illustration only.

It should be noted that there is no theoretical limit on the number of row lines 34 and column lines 36 that can be employed or on the outside dimension of an AMLCD 10. The processing equipment provides a practical limit on the outside dimension, which limit is continually changing as the equipment is improved.

The problem encountered with manufacturing AMLCD's is that if the AMLCD 10 contains defective TFT's or other circuit elements causing one or more pixels to be inoperative, the display generally must be discarded. One optional technique of masking defective pixels 42, is to employ an additional transistor 49 with the pixel 42 coupling the pixel 42 to an adjacent row R1. Then, when row R1 is written the data is applied not only to the previous pixel 42', but also through the transistor 49 into the pixel 42. When row R2 then is written the data for the pixel 42 is written over the data from the previous pixel through the transistor 46. If, however, the transistor 46 is defective, the pixel 42 will not show as inoperative, but instead will retain the data from the previous row R1. This masks the fact that the pixel 42 is not operating correctly.

As another option, the pixel 42 also can include a storage capacitor 50 coupled to the row R1 which maintains and stabilizes the voltage written into the pixel 42 during each frame.

Figure 2:
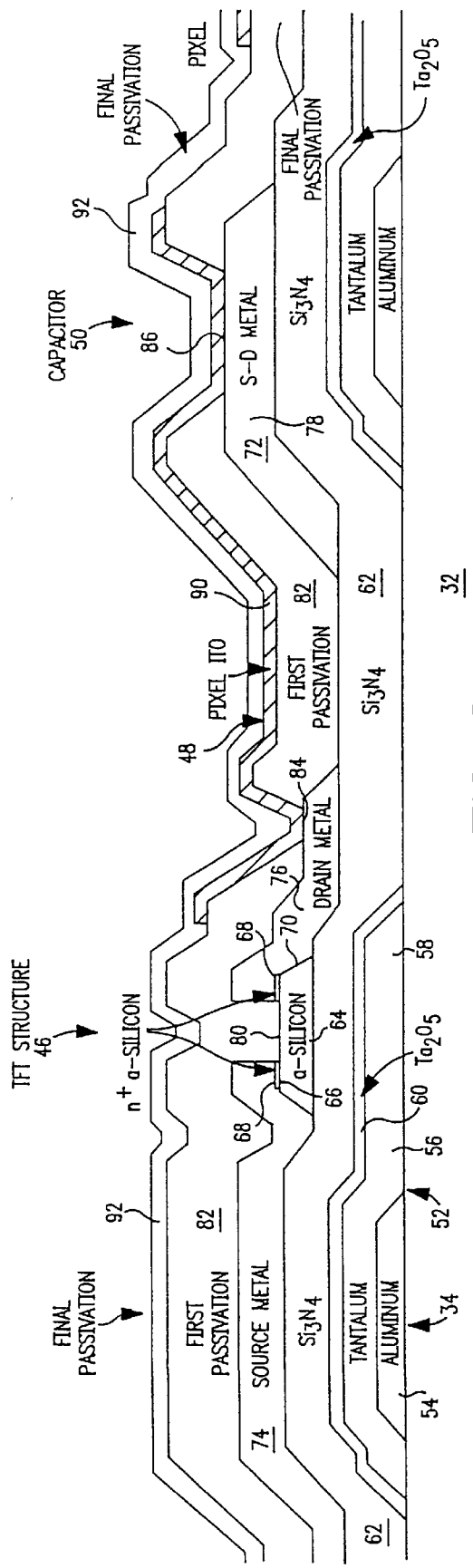
FIG. 2 is a cross-section of one embodiment of an inverted gate transistor of a prior application.
Figure 3:
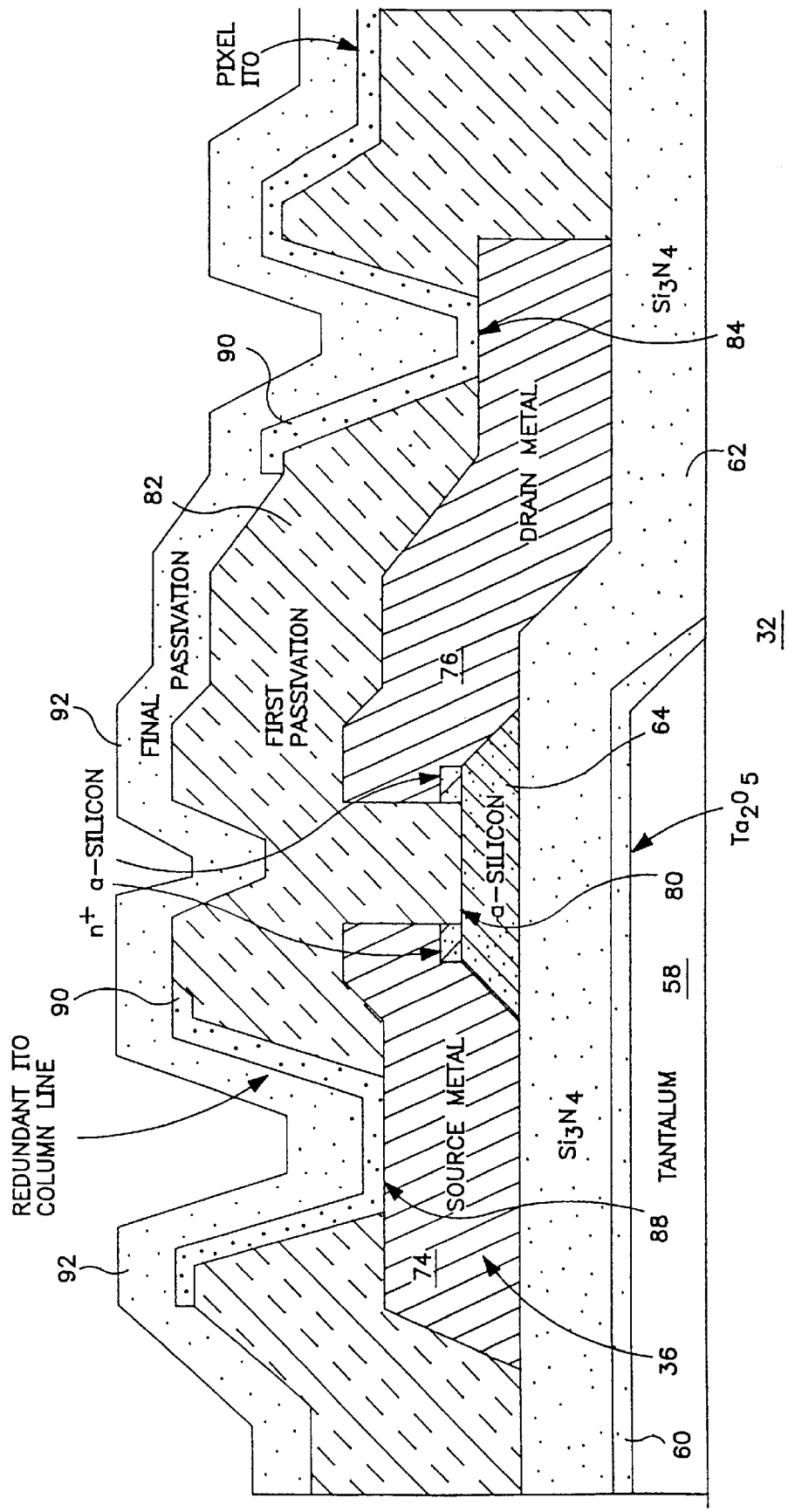
FIG. 3 is a second cross-section of the transistor embodiment of FIG. 2.

The TFT 46 and the AMLCD 10 are formed to enhance the yield of active pixels. The TFT 46 and manufacturing thereof will be described with reference to FIGS. 2 and 3. The TFT 46 is fully described in copending application Ser. No. 08/497,371, entitled IMPROVED PERFORMANCE MATRIX TFT, METHOD OF MAKING AND MATRIX DISPLAYS INCORPORATING THE TFT, filed Jul. 31, 1995 and incorporated herein by reference. The TFT 46 is formed as an inverted gate TFT with a gate 52 being deposited first as the row line 34. The completed TFT 46 is illustrated in FIGS. 2 and 3, while the various process steps are best illustrated and described in Ser. No. 08/497,371. Although the various layer thicknesses are not critical to the TFT 46, preferable thicknesses and materials are described to form a preferred embodiment of the TFT 46 and the AMLCD 10.

The gate 52 preferably is formed of two layers of metal, a first layer of aluminum, preferably an aluminum/copper alloy, is deposited and patterned to form a line element 54. To form a redundant row line 34, a second gate layer of tantalum is deposited over the aluminum element 54 and patterned to form a line element 56 which covers the element 54. The element 56 also has fingers 58 which form the actual gates for the individual TFT's 46. The line element 54 preferably is formed from aluminum or an aluminum alloy. Aluminum is utilized for long lines because of its high conductivity, but is not critical for small displays and can be eliminated from small displays if desired. The aluminum is deposited to about 1200 Angstroms to provide conductivity, but still be thin enough to prevent step coverage problems over the element 54. The tantalum element 56 or other anodic refractory metal preferably is deposited separately for redundancy to about 2000 Angstroms. The fingers 58 which form the gates for the TFT 46 do not require the aluminum layer and typically are formed only of tantalum.

A first gate insulator layer 60 is then formed by anodizing the exposed tantalum element 56, which is hard anodized to form the insulator layer 60 of tantalum oxide, $Ta_2O_5$. A hard anodization can be performed by utilizing a solution of 0.1 to 4.0 percent citric acid in deionized water. A voltage of about sixty (60) volts can be utilized which will form a very precise and uniform oxide layer 60 to about fifteen (15) Angstroms per volt or about a thickness of 900 Angstroms. The pads 38 and 40 can be covered with photo resist to prevent anodization of the pads or can be anodized and then later etched.

Alternatively, the first gate insulator 60 can be formed by a deposited dielectric layer. A second or redundant gate insulator 62 then is deposited, preferably silicon nitride, $Si_3N_4$, to a thickness of about 3000 Angstroms. Two additional layers sequentially are deposited, a layer of amorphous silicon 64 and then a layer of N+ doped amorphous silicon 66. The N+ layer 66 and amorphous silicon layer 64 selectively are etched to leave discrete areas 70 over the gate portions 58 on the nitride layer 62. The amorphous silicon layer 64 is deposited to a thickness of about 1500 Angstroms and the N+ layer 66 is deposited to a thickness of about 300 Angstroms. After patterning the remaining N+ layer forms the ohmic contact portions 68.

A reanodization can be performed before the next metal layer is deposited to prevent potential shorts, especially at any point that the drain or source metal overlies the gate metal. The reanodization is performed at a voltage at least twice the maximum voltage normally present between the source and gate lines. The reanodization will form a new oxide in the tantalum or underlying aluminum layer to prevent a later deposited metal from shorting to the gate line through a pinhole which exposed the gate metal.

A source-drain (S-D) layer 72 then is deposited, preferably formed from a plurality of metal layers for large displays. For small displays, the layer 72 can be a single metal layer, such as aluminum or molybdenum. A preferable large device multilayer 72 is formed by depositing a first barrier layer of molybdenum to a thickness on the order of 500 Angstroms. A second conductivity enhancing layer of aluminum or aluminum alloy then is deposited to a thickness of about 5000 Angstroms. A third barrier layer of molybdenum or molybdenum alloy then is deposited to a thickness of about 300 Angstroms. Alternatively, only the first two layers are required to be deposited.

The S-D layer 72 then is patterned to form a source portion 74, a drain portion 76 and a top capacitor contact portion 78. A transistor channel region 80 then is formed between the source and drain portions 74 and 76 by removing the N+ doped layer between the contact portions 68; which remain under the S-D metal portions 74 and 76. At this point the transistor 46 is electrically functional. The storage capacitor 50 also now is electrically functional and is formed by the contact portion 78 and the underlying portions of the nitride layer 62, the oxide layer 60 and the gate 52. Both the transistor 46 and the capacitor 50 can now be electrically tested, as desired.

A first passivation layer 82 then is deposited, preferably formed of $Si_3N_4$ to a thickness of about 7000 Angstroms. This dielectric layer also could be formed from deposited $SiO_2$, spin on glass (SOG) or other organic dielectric materials. The layer 82 is patterned to form a drain contact opening 84 and a capacitor contact opening 86. When a redundant column line is to be formed, vias 88 are formed to provide contacts to the underlying column line 36.

A pixel ITO layer 90 then is deposited and patterned to form the drain contact at the opening 84, the capacitor contact at the opening 86, the redundant column line by contacting through the vias 88 (where applicable) and the pixel 48. The pixel 48 is not shown to scale and the section is offset to include both the transistor 46 and the capacitor structure 50, which are staggered from one another. The section does not fully illustrate the electrical separation between the column ITO and the pixel ITO 48 (see FIG. 1). The additional transistor 49 (FIG. 1) is not illustrated, but can be formed in the same manner as the transistor structure 46.

The TFT structure 46, then is completed by forming a final passivation layer 92. The passivation layer 92 is formed to a thickness of about 2000–3000 Angstroms in the same manner as the layer 82. The layer 92 could also be formed on the color filter substrate or can be formed on both.

Although described herein preferably with an inverted gate TFT, the multilayer line can be utilized with any type of matrix. Preferably the matrix includes a non-linear control element, such as a thin film diode, MIM or TFT, however, the advantages of the multilayer line are not restricted to any particular non-linear control element.

In inverted gate TFT LCD structures such as the TFT 46, the gate metal is generally deposited first, directly onto the glass substrate 32. There are a number of requirements for a high performance gate metal.

1. High Conductivity—Since the gate metal line 52 and the column metal line 36 block light going through an LCD panel, manufacturers try to make the width of the gate and column lines as narrow as possible. However, the resistance of these lines increase with a decrease in their width. For small displays with low information content (low number of row and column lines) and a low number of gray shades, higher resistance row and/or column lines can be tolerated. In these matrices, a thin (less than 2,000 Angstroms) refractory metal such as Molybdenum, Tantalum, Chrome, Nickel, Nichrome, Titanium, or Tungsten can be utilized as the row and/or column metal. The maximum deposited thickness of refractory metals is generally limited to approximately 2,000 angstroms because of stress and cracking of thicker lines. When low resistance lines are required, high conductivity metal such as aluminum or copper can be utilized in conjunction with a refractory metal to form the row or column metal 34, 36. In either case, formation of a row or column metal line is accomplished by: 1) depositing the metal(s), 2) applying photo resist, 3) soft baking the photo resist, 4) exposing a pattern onto the photo resist, 5) developing the exposed or unexposed photo resist, 6) hard baking the photo resist prior to etch, 7) dry or wet etching the metal layer and 8) stripping the photo resist.

2. Hillock Suppression—The first metal, whether a row or column metal, must not form hillocks when heated to the required subsequent processing temperatures of 300 degrees Centigrade or higher. Hillock formation can puncture the inter-metal dielectric and cause shorts between the row and column metal. In a TFT structure with an inverted gate such as the TFT 46, the row or gate metal can short to the source or drain metal causing the TFT to be inoperative. This problem is not limited to AMLCD's and can occur in any X-Y matrix addressed array after patterning the first metal followed by subsequent elevated temperature processing. The high conductivity metals such as aluminum and copper are the most susceptible to this problem.

3. Low Step Coverage Profile—If the gate metal is made thick (3,000 Angstroms or more) to lower the row line 34 resistance, then the step coverage of the second metal or the column line 36 over the first metal and inter-metal dielectric at the crossovers 44 can cause defects in the crossover 44. The dielectric can fail to completely cover the first metal and hence the second metal can short to the first metal. The dielectric also can cover the first metal, but the second metal and/or the dielectric can be stressed to provide a subsequent weak spot for electric breakdown. Further, the second metal can fail to cover the dielectric causing a void/open in the second metal line. It would be desirable to planarize or minimize the step over the first metal line 34.

4. Anodic Oxide Formation of First Metal—it is important that the first metal (gate) be capable of being anodized (converted to metal oxide) for the following reasons:

a. In a crossover of a two layer metal system as illustrated in FIGS. 4A and 4B, the two metals 100, 102 are separated by at least one dielectric 104 to prevent shorting between the metals. If the inter-metal dielectric should happen to have a pinhole (not illustrated), the two metals 100, 102 can short and cause the circuit to be inoperative. By first anodizing the surface of the gate or first metal 100 to form a metal oxide layer 106 followed by deposition of the inter-metal dielectric 104, a double insulator is formed between the two metals 100, 102. The probability of a pinhole in the same location of both dielectrics 104, 106, is extremely low, thus creating a high yielding two layer metal system. This is extremely important in large X-Y matrix circuits which can have millions of crossovers 44.

b. In the TFT structure 46, the anodic metal oxide 106 can be considered a capacitor. This capacitor is below the gate insulator and capacitively couples the gate and the gate insulator. Although this capacitor does not enhance the performance of the TFT, it prevents potential shorts between the gate 100 and the source-drain metal 102, in the event that there is a pinhole in the gate insulator 104.

c. In TFT Active Matrix Liquid Crystal Display (AMLCD) structures 10, it is sometimes advantageous to form storage capacitors over the gate lines 34 to store charge and stabilize the voltage across the LCD pixels 42. Assume that row 2 of a display is being addressed, then the drain contacts of all the TFT's on that row line are connected to the pixel ITO and to the storage capacitor 50 which is connected to row 1 or the previously addressed row line. The storage capacitors 50 for all the pixels 42 addressed by row 2 are vertically above row 1, as illustrated in FIG. 2. Since it is desirous to maximize the open pixel area and minimize the area of the row lines, a thin high quality, high dielectric constant, low leakage insulator is required. The anodization of tantalum which forms $Ta_2O_5$ is ideal for this application.

d. Other two and three element non-linear control devices can be utilized, such as diodes and MIM'S. Metal-Insulator-Metal (MIM) structures can also be formed using the anodization process of the first metal. MIM structures are sometimes used as a non-linear element to drive LCD pixels in lieu of TFI's.

Problems With Prior Art First Metal Structures

1. Refractory First Metal Gate Structures

Refractory metals such as the ones listed previously generally have very good adhesion to the substrates, do not form hillocks at elevated temperatures and have high resistivity. However, of those metals only Ta, Nb, Ti and Zr can be anodized to give non-porous oxides which are useful for capacitors 50 and inter-metal-dielectrics 106. The use of a refractory metal layer 108 alone, FIG. 5A, is limited to circuits and small display matrices where line resistance is not a serious consideration.

2. Aluminum or Aluminum (Si and/or Cu) Alloy First Metal Gate Structures

Aluminum and aluminum alloys are highly conductive but tend to form hillocks at elevated temperatures. Hillock formation can be somewhat suppressed by hard anodizing the aluminum in a 1% solution of citric acid and deionized water, however, as the thickness of the aluminum is increased, the formation of hillocks is also increased. Because of the hillock formation combined with TFT thin gate insulators (3,000 Angstroms or less), only thin layers (< than a few thousand angstroms) can be used as a gate metal for TFT's. The anodization of aluminum forms a stable aluminum oxide ($Al_2O_3$) with a dielectric constant of about 7 which could be used as a capacitor, however, the required high temperature processing subsequent to the capacitor formation degrades its performance.

3. Refractory Metal/Aluminum Metal Combinations as a First Metal Gate Structure

In an effort to suppress hillock formation and obtain high conductivity, combinations of aluminum and refractory metal have been implemented. One approach is to first deposit about 1,200 Angstroms of aluminum 110, pattern the aluminum, and then deposit about 2,000 Angstroms of tantalum 112 over the aluminum and then pattern the tantalum separately from the aluminum. This approach offers the benefit of redundancy at the expense of two masking layers and two separate depositions. To obtain good coverage of the tantalum over the aluminum, the tantalum layer must be about 1.5 times the thickness of the aluminum layer 110. Since the maximum reasonable thickness of tantalum or other refractory metal is about 2,000 Angstroms, the aluminum layer cannot exceed a thickness of 1,300 Angstroms. Although this approach works for medium size displays, thicker aluminum layers are required for large area displays to provide sufficient conductivity for many gray scales.

Another approach is to sequentially deposit the aluminum 110 and then the tantalum 112, pattern with photo resist, etch the tantalum and then the aluminum. The disadvantage of this approach is that the aluminum etches from under the edge of the tantalum leaving a ledge 114 as illustrated in FIG. 5C. Air voids and chemicals can be trapped under the ledge 114 during subsequent processing depositions, causing step coverage and reliability problems.

4. Thick Etched First Metal Systems

In general, etched metal films 108 with a thickness of 5,000 Angstroms or greater create a step coverage problem for both the inter-metal dielectric 104 and the second metal 102. In the case of TFT's where the gate insulator is generally limited to maximum of about 3,000 Angstroms, the problem is worse. Attempts are being made to taper the edge of the metal layer 108 during the etch process to minimize the step coverage problem.

A first embodiment of a multilayer high conductivity line, described as part of an improved inverted gate matrix TFT 120 of the present invention and the process stages to form the TFT 120 is illustrated in FIGS. 6A–6Q. Starting with a clean glass substrate 122, sequential metal layers are deposited, a first layer 124 of Ta (50–100 Angstroms), a second layer 126 of Al or Al alloy (1,000–10,000 Angstroms) and then a third layer 128 of Ta (1,000–2,000 Angstroms). A photo resist 130 (FIG. 6B) is then applied and patterned to form a first metal layer 132. All of the metals which are to be anodized must be connected to a bus bar (not illustrated) which leads to the edge of the substrate where electrical connection is made during the anodization process. This electrical contact area must be kept out of the anodization solution during anodization.

The top Ta layer is then dry etched with a fluorine based plasma or RIE (Reactive Ion Etch) chemistry such as $NF_3$ or $CF_4$. Since neither the photo resist or the Al layer 126 will etch in fluorine based chemistries, the etch stops on the Al layer 126. The substrate 122 is then placed in an anodizing solution of deionized water and 2% oxalic acid. Other acids or concentrations can be used which will soft anodize aluminum—i.e. form a porous $Al_2O_3$ which will form a thickness independent of the anodization voltage. The aluminum is then anodized in constant current mode of 0.05 to 0.5 $ma/cm^2$ and a voltage clamp of approximately 4 to 10 volts. During the anodization process, the resist 130 over the unetched top Ta layer 132 keeps the tantalum from anodizing. The anodization continues until such time that all the exposed aluminum 134 converts to $Al_2O_3$, which is proportionally dependent on the thickness of the Al layer 126 (FIG. 6C).

As the anodization of the Al layer 126 is being completed, the anodization voltage begins to rise until it reaches the clamp voltage (4–10 volts), at which time the current begins to fall. In ten (10) minutes the current will have fallen to a few milliamps, at which time the substrate 122 or substrates are rinsed and dried. After anodization, the substrate 122 will be semi-transmissive and semi-metallic in nature because there still is the thin layer 124 of Ta which has not yet been totally converted to $Ta_2O_5$. The refractive index of the $Al_2O_3$ is 1.7 to 1.8 and has very little impact on the transmission of the substrate 122.

The significance of the bottom tantalum layer 124 of the above structure is that it has extremely good adhesion to the glass substrate 122 and does not become totally anodized during the first anodization step. The thickness of the first Ta layer 124 is chosen such that the layer 124 does not become totally anodized by the clamp voltage above. The reason to prevent the bottom Ta layer 124 from totally being anodized is because it should remain a conductive sheet during the anodization of the aluminum to ensure that the aluminum layer 126 is uniformly and totally converted to $Al_2O_3$. If the aluminum layer 126 were deposited directly on the glass 122 without the bottom Ta layer, the anodization process would be difficult to complete because islands of electrical floating thin Al will remain which is highly reflective and has very poor optical transmission (not acceptable for substrates which require high transmission). The thickness of the $Ta_2O_5$ layer will generally be 15–17 Angstroms/volt. It should be noted that the aluminum under the Ta layer 132 does not anodize other than a small undercut along the edges which is generally proportional to the Al thickness. Therefore, the aluminum can be made very thick for high conductivity and yet maintain a planar structure. Since the $Al_2O_3$ layer 134 is generally 10% thicker than the unanodized Al layer 126, the step from the top of the Ta layer 136 to the $Al_2O_3$ layer 134 is smaller than the thickness of the Ta layer 132.

The next step of the operation is to strip the photo resist 130 (FIG. 6D). The substrate 122 is then prepared for the second anodization step in a solution of D.I. water and 1% citric acid (FIG. 6E). Unlike oxalic acid, citric acid forms a hard anodization of both aluminum and tantalum; i.e. the thickness of the $Al_2O_3$ and $Ta_2O_5$ are dependent on the anodization voltage. The substrate 122 is then anodized with a constant current source of 0.02 $ma/cm^2$ and a clamp voltage of 60 volts. During the first part of the anodization, the voltage rise is slow as the anodization of the bottom Ta layer 124 is taking place. Once the anodization of the bottom Ta layer 124 is complete (approximately 11 volts), the voltage rises more quickly as the remaining smaller area Ta on the gate line is anodized until the clamp voltage of 60 volts is reached. The current then quickly drops after 5 minutes to a few milliamps. During this process, the bottom Ta layer 124 is completely anodized during the initial part of the anodization, and then a top Ta layer 136 over the gate lines or first metal 126 is anodized to 60 volts corresponding approximately to a 900 to 1000 Angstroms layer 136 of $Ta_2O_5$.

Figure 6J:
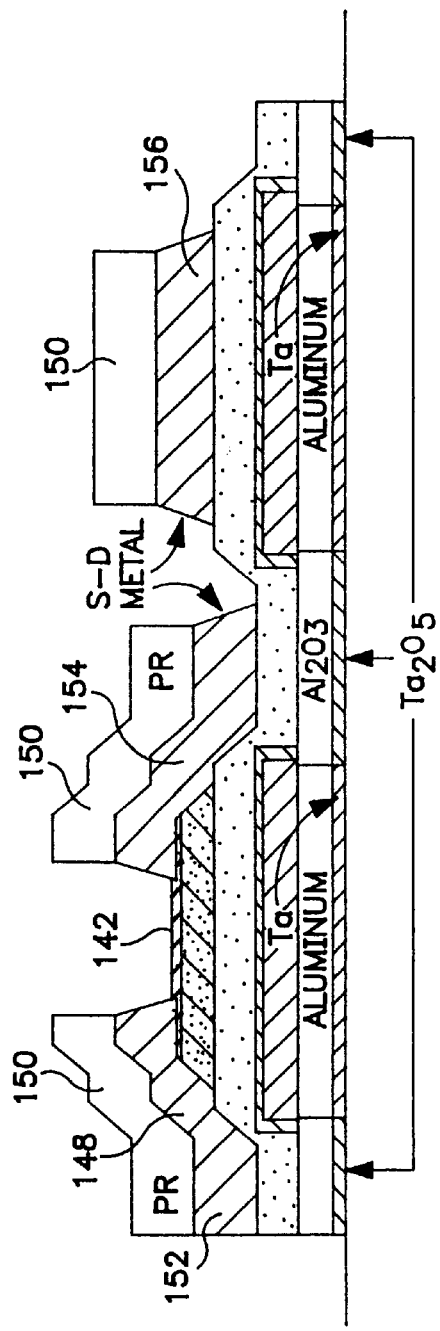
FIGS. 6A–6Q are partial sectional views of the manufacturing steps of one preferred multilayer line and inverted gate transistor embodiment and display.

The top Ta layer 136 over the aluminum layer 126 serves three functions. First, it serves as a hillock suppressor to prevent the underlying aluminum 126 from hillocking and causing a short to the subsequent second (FIG. 6J) metal. Second, it can be used to form a capacitor (FIG. 6D) to the gate line which exhibits a very high dielectric constant. Third, it forms a capacitively coupled TFT structure to the subsequent $Si_3N_4$ gate insulator and source-drain metal (FIG. 6J). Since the dielectric constant of $Ta_2O_5$ is 27, it forms a very high capacitance/unit area—which is ideally suited for capacitors. The reason for utilizing citric acid during the second anodization process is that as the voltage increases toward 60 volts, the undercutting or anodization of aluminum under the Ta is minimized and there is less chance of creating an open row or gate line. This can become critical when the row lines are very narrow.

The remaining manufacturing stages are similar to those described with respect to the TFT 46. A $Si_3N_4$ insulating layer 138 is deposited (FIG. 6F) followed by an amorphous silicon (a-silicon) layer 140, an n + a-silicon layer 142, followed by a photo resist layer 144. The layer 144 is patterned and the layers 140 and 142 then are etched to form the basic transistor structure illustrated in FIG. 6F.

Figure 6K:
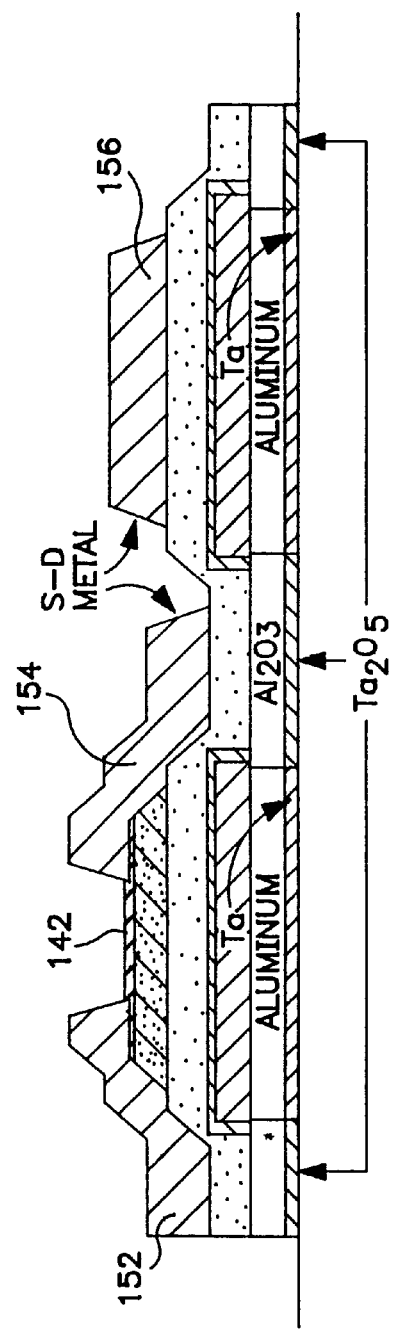

Referring to FIG. 6G, the remaining photo resist layer 144 is stripped and the structure is then reanodized to eliminate any potential pinhole defects. Next, (FIG. 6H), a photo resist layer 146 is formed, patterned (not illustrated) and the layer 138 is etched to expose the contact pads 38 and 40 (not illustrated). The remaining photo resist layer 146 then is removed. As illustrated in FIG. 6J, a source-drain metal layer 148 then is deposited, followed by a photo resist layer 150. The layer 150 is patterned and the underlying layer 148 is etched to form a source portion 152, a drain portion 154 and a capacitor contact portion 156. The remaining photo resist layer 150 then is stripped (FIG. 6K).

Figure 6L:
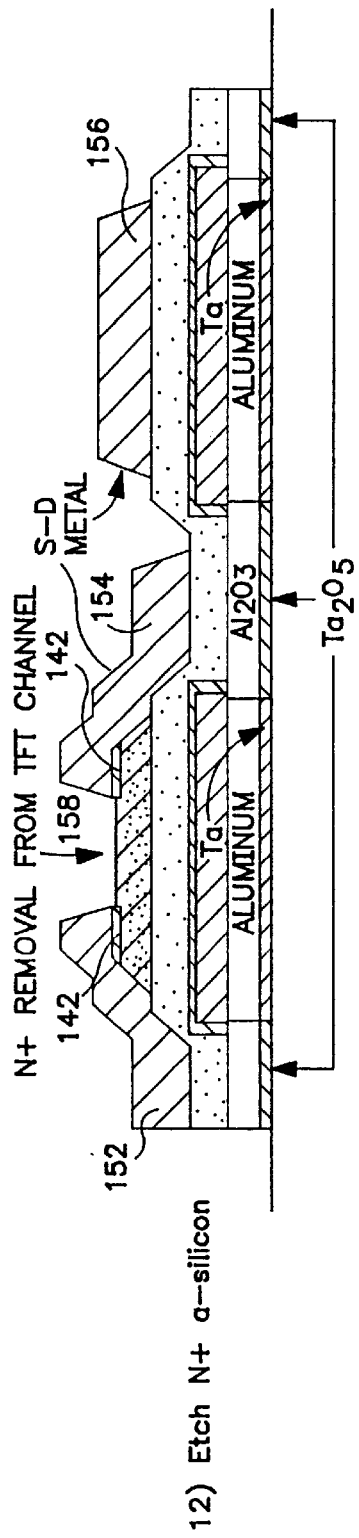
Figure 6M:
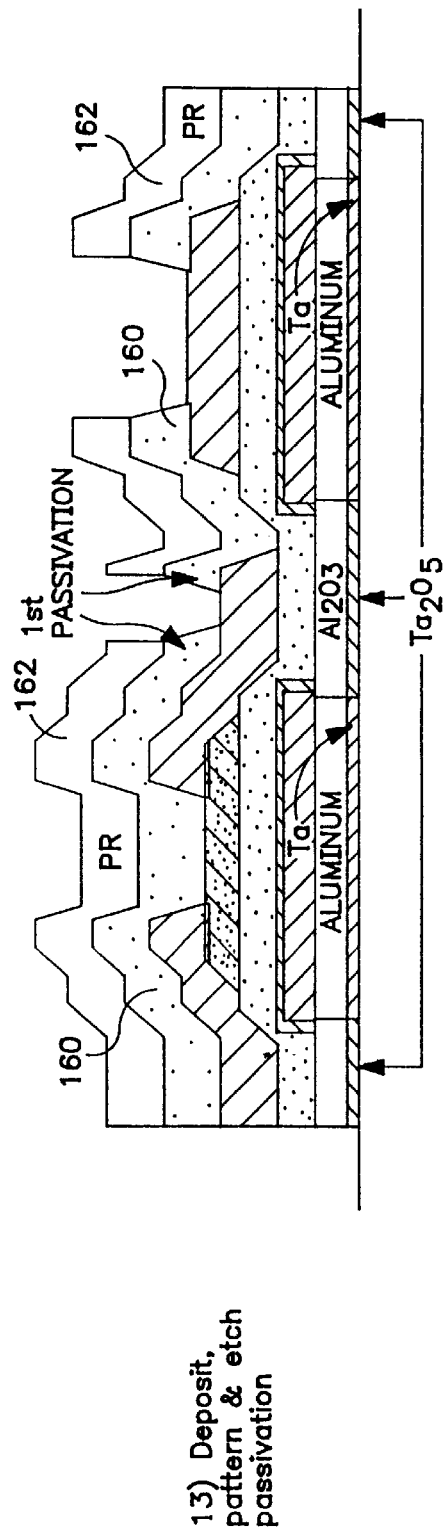

A central portion 158 of the n + a-silicon layer 142 then is removed by etching to form the transistor channel (FIG. 6L). A first passivation layer 160 is deposited (FIG. 6M), followed by a photo resist layer 162. The layer 162 is patterned and the layer 160 then is etched followed by removal of the remaining photo resist layer 162 to form a drain via 164 and a capacitor via 166 (FIG. 6N).

An ITO layer 168 then is deposited, followed by a photo resist layer 170. The layer 170 is patterned and the ITO layer 168 is etched to form the pixel pad 48 which connects to the capacitor 50 of the previously addressed row line 34 and to the drain of the TFT 46 in the addressed row line. The remaining photo resist layer 170 then is stripped (FIG. 6P).

The TFT 120 and the AMLCD 10 is finalized by forming a second passivation layer 172 which is patterned and etched off the pads 38 and 40 (not illustrated) as illustrated in FIG. 6Q.

Figure 7A:
FIGS. 7A–7Q are partial sectional views of the manufacturing steps of a second multilayer line and transistor embodiment and display.
Figure 7B:
Figure 7C:
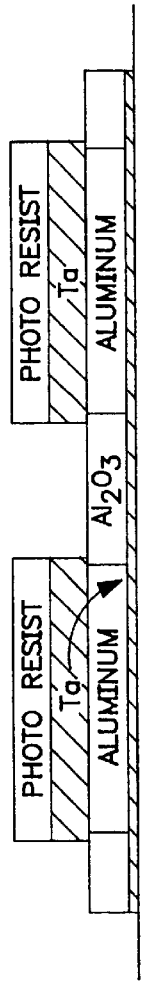
Figure 7D:
Figure 7E:
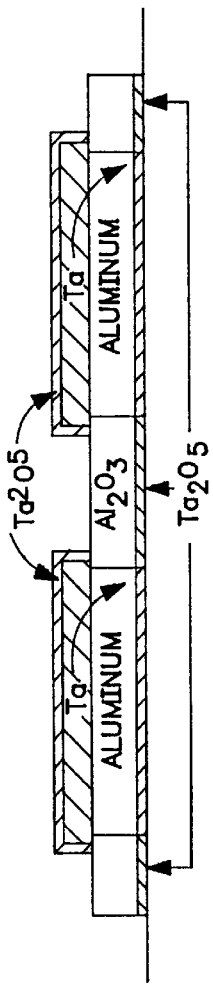

An alternative TFT embodiment 180 and the process steps for the TFT 180 are illustrated in FIGS. 7A–7Q. The TFT 180 and the AMLCD are essentially identical to the TFT 120 described in FIGS. 6A–6Q. The major difference and therefore the only description of the process steps of the TFT 180 is the formation of the capacitor 50'.

The capacitor 50' is formed by etching the $Si_3N_4$ layer 138 after patterning the photo resist layer 146 to open the contact pads and to form a via 182 to the $Ta_2O_5$ layer 136, as illustrated in FIG. 7H. The capacitor contact metal 156 then is deposited and patterned from the layer 148 directly on the layer 136. The rest of the transistor 180 and the AMLCD processing is substantially identical to that of the TFT 120.

Many modifications and variations of the present invention are possible in light of the above teachings. As above described, the anodized insulative layer 136 (FIG. 6E) could be replaced with a deposited insulative layer and also could be combined with such a deposited layer. In this case, the layer 124 could be anodized outside the gate in step three (FIG. 6C). The passivation layer 172 (FIG. 6Q) could be roller coated over the active pixel areas and then the pads 38 and 40 would not have to be etched. Also, after step two (FIG. 6B), the photoresist (PR) can be stripped and then step three (FIG. 6C) can be performed. In this case, step four (FIG. 6D) is eliminated, but then the pads 38 and 40 will have a layer of $TaO_5$ on them. This $TaO_5$ layer must then be etched in step 8 (FIG. 6H) to clear the contact pads 38 and 40. It is therefore to be understood that within the scope of the appended claims, the invention may be practiced otherwise than as specifically described.

What is claimed is:

1. An improved inverted gate thin film transistor, the improvement comprising:
    a multilayer gate formed on an insulating substrate, said multilayer gate including a first refractory metal layer formed on said substrate, an aluminum layer formed on said first layer and a second refractory metal layer formed on said aluminum layer;
    said second refractory metal layer patterned to form said gate; and
    said aluminum layer anodized adjacent said gate to prevent step coverage problems in succeeding layers.

2. The improvement as defined in claim 1 including said first and second refractory metal layers formed from tantalum.

3. The improvement as defined in claim 1 including said aluminum layer formed from an aluminum alloy.

4. The improvement as defined in claim 1 including a dielectric layer formed on said second refractory metal layer.

5. The improvement as defined in claim 4 including said second refractory metal layer having an anodized surface.

6. An improved matrix, the improvement comprising:
    a multilayer line formed on an insulating substrate, said multilayer line including a first refractory metal layer formed on said substrate, an aluminum layer formed on said first layer and a second refractory metal layer formed on said aluminum layer;
    said second refractory metal layer patterned to form said line; and
    said aluminum layer anodized adjacent said line to prevent step coverage problems in succeeding layers.

7. The improvement as defined in claim 6 including said first and second refractory metal layers formed from tantalum.

8. The improvement as defined in claim 6 including said aluminum layer formed from an aluminum alloy.

9. The improvement as defined in claim 6 including a dielectric layer formed on said second refractory metal layer.

10. The improvement as defined in claim 9 including said second refractory metal layer having an anodized surface.

11. The improvement as defined in claim 6 including forming an active matrix display, including a plurality of non-linear control elements, each coupling a pixel to said line.

12. The improvement as defined in claim 11 including said control element being an inverted gate thin film transistor, with said line forming said gate.

13. The improvement as defined in claim 12 including a storage capacitor coupled between each said pixel and an adjacent row line.

14. The improvement as defined in claim 13 including said storage capacitor formed as a portion of said adjacent row or column line.

15. The improvement as defined in claim 14 including said storage capacitor formed from a portion of said adjacent row line, and said row line formed with said gate as a multilayer row line.

16. The improvement as defined in claim 12 including a dielectric layer formed over said second refractory layer and a metal oxide capacitor contact formed on said dielectric layer.

17. The improvement as defined in claim 16 including a metal oxide capacitor contact formed on said dielectric layer.

* * * * *